US007240151B1

(12) United States Patent
Todd et al.

(10) Patent No.: US 7,240,151 B1
(45) Date of Patent: *Jul. 3, 2007

(54) METHODS AND APPARATUS FOR TRANSFERRING DATA IN A CONTENT ADDRESSABLE COMPUTER SYSTEM

(75) Inventors: Stephen J. Todd, Shrewsbury, MA (US); Michael Kilian, Harvard, MA (US)

(73) Assignee: EMC Corporation, Hopkinton, MA (US)

( * ) Notice: Subject to any disclaimer, the term of this patent is extended or adjusted under 35 U.S.C. 154(b) by 361 days.

This patent is subject to a terminal disclaimer.

(21) Appl. No.: 10/836,502

(22) Filed: Apr. 30, 2004

(51) Int. Cl.
*G06F 12/00* (2006.01)
(52) U.S. Cl. ...................................... 711/108
(58) Field of Classification Search ................ 711/122, 711/108; 709/213, 238
See application file for complete search history.

(56) References Cited

U.S. PATENT DOCUMENTS

| 6,311,216 | B1 * | 10/2001 | Smith et al. ................. 709/226 |
| 6,338,117 | B1 * | 1/2002 | Challenger et al. ......... 711/122 |
| 6,532,493 | B1 * | 3/2003 | Aviani et al. ................ 709/224 |
| 6,553,411 | B1 * | 4/2003 | Dias et al. ................... 709/219 |
| 6,601,090 | B1 * | 7/2003 | Gurijala et al. ............. 709/213 |
| 7,062,570 | B2 * | 6/2006 | Hong et al. .................. 709/238 |
| 2004/0220975 | A1 * | 11/2004 | Carpentier et al. ......... 707/200 |

OTHER PUBLICATIONS

U.S. Appl. No. 10/701,373, filed Nov. 3, 2003, William McGovern.

* cited by examiner

*Primary Examiner*—Pierre Bataille
*Assistant Examiner*—Paul Schlie
(74) *Attorney, Agent, or Firm*—Wolf, Greenfield & Sacks, P.C.

(57) ABSTRACT

Embodiments of the present invention are directed to a method and apparatus for receiving an input/output (I/O) request from a host computer that specifies an operation to be performed on a content addressable storage (CAS) system and determining which operation is specified by the request before receipt of the I/O request by a content addressable storage system. In another embodiment, an I/O request from a host computer is received by a first CAS which determines if the request is to be processed by another CAS system. When it is determined that the request is to be processed by another CAS system, the first CAS system may forward the request to the other CAS system. In another embodiment, an appliance receives an I/O request from a host computer to perform an operation that accesses a unit of content. The appliance may set up a communication session between the host and a CAS system so that the unit of content may be transmitted between the host and the CAS system without passing through the appliance.

81 Claims, 8 Drawing Sheets

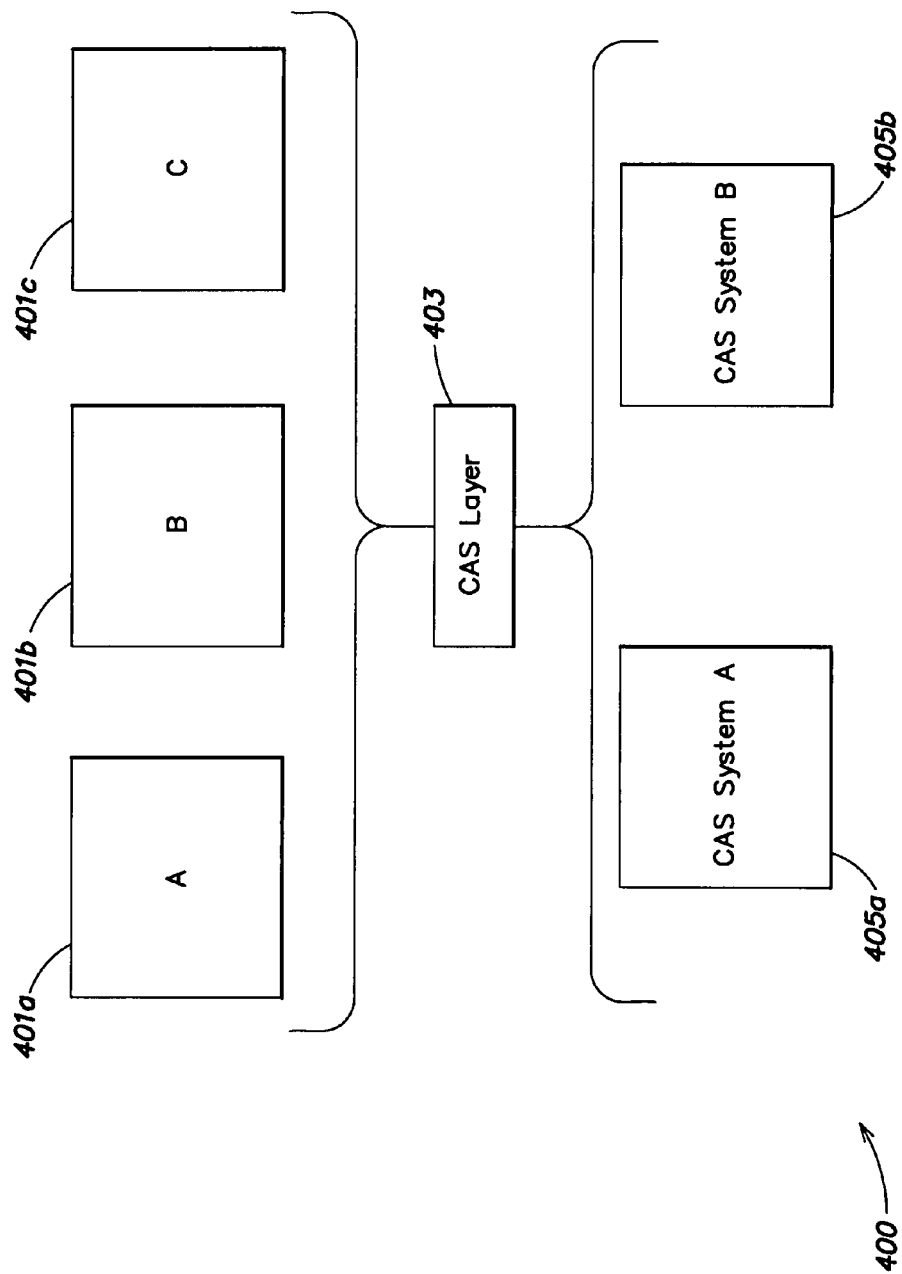

METHODS AND APPARATUS FOR TRANSFERRING DATA IN A CONTENT ADDRESSABLE COMPUTER SYSTEM

FIELD OF THE INVENTION

The invention relates generally to content addressable computer systems.

DESCRIPTION OF THE RELATED ART

Virtually all computer application programs rely on storage that may be used to store computer code and data manipulated by the computer code. A typical computer system includes one or more host computers that execute such application programs and one or more storage systems that store data. In such a computer system, a typical storage system usually includes a plurality of physical devices (e.g., disk devices) on which the data is stored, although the host computer and the application programs that store data on the storage system often are unaware of the physical device configuration and on which physical devices data is stored.

Instead, the host computer and application programs are presented with a logical view of the storage system. The host computer and application programs may assume that the data is stored in a manner that has very little to do with how the data is placed onto the physical devices. For example, the application programs may assume data is stored in a file system that includes a number of directories containing files. Software on the host computer (e.g., an operating system) may map the file system onto one or more logical volumes of storage space presented by one or more storage systems to the host computer.

For example, referring to FIG. 1, a file system may be mapped onto three volumes, 101a, 101 b, and 101c presented by a storage system to a host computer. The host computer may issue access requests (e.g., read and write requests) to the storage system by specifying a logical volume and a block or set of blocks within that logical volume at which to store data (i.e., in the case of a write request) or from which to retrieve data (i.e., in the case of the read request). When the storage system is an intelligent storage system, a mapping layer 103 in the storage system maps the access requests from the host computer into requests to the physical devices on which the data is stored. For example, in FIG. 1, the storage system includes physical storage devices 105, 107, and 109. Data in logical volume 101a (volume "A") is stored on physical devices 105, 107, and 109, data in logical volume 101b (volume "B") is stored on physical device 105, and data in logical volume 101c (volume "C") is stored on physical devices 105 and 109.

The access requests received and processed by the storage system identify units of data to be accessed using logical volume and block addresses. Such storage systems are known as "block I/O" storage systems. Although the logical volumes presented by the storage system to the host may not map in a one-to-one manner to physical storage devices, they are perceived by the host as corresponding to physical storage devices, and the specification of a logical volume and block address does specify (in a manner determined by the mapping layer 103) where the referenced data is physically stored within the storage system. As used herein, reference to an address specifying where a unit of data is logically stored on a storage system indicates an address that specifies a portion of storage space allocated by a storage system to a host, but that may not correspond directly to a physical storage device.

In contrast to block I/O storage systems, some storage systems receive and process access requests that identify data or other content using a content address, rather than an address that specifies where the data is physically or logically stored in the storage system. As used herein, a content address is an address that is computed, at least in part, from the content of its corresponding unit of content, which can be data and/or metadata. For example, a content address for a unit of content may be computed by hashing the unit of content and using the resulting hash value as the content address. Storage systems that allow content to be identified by a content address are termed content addressable storage (CAS) systems.

FIG. 2A shows a computer system that includes a CAS system 203 and a host computer 201, with the host computer 201 sending a write request 205 to the CAS system. Write request 205 includes content unit 207 that is to be stored on the CAS system. In response to receiving the write request and/or storing the content unit, the CAS system may compute the content address of the content unit and send response 209 back to host computer 201 to acknowledge receipt of the write request and return the content address for content unit 207 to the host computer so that the host computer may later use the content address to access content unit 207. Alternatively, the host 207 may generate content address 209 and pass it to the storage system along with content unit 207.

FIG. 2B illustrates an example of the processing of a read request in the computer system of FIG. 2B. Host computer 201 sends the read request 211 to CAS system 203. The read request identifies the unit of content to be returned by CAS system 203 by including the content address 209 in the request. In response to read request 211, CAS system 203 returns to host computer 201 the content unit 207 that corresponds to content address 209.

In a CAS system, unlike block I/O storage systems, the address by which a unit of data is accessed (i.e., the content address) does not specify the physical or logical location at which the unit of data is stored. Thus, in a CAS system, if the physical or logical location at which the unit of content is stored changes, the address by which host computers access the unit of content may remain the same. In contrast, in a block I/O storage system, if the logical location at which the unit of content is stored changes, host computers accessing the unit of content must be made aware of the location change and then use the new logical location of the unit of content for future accesses.

SUMMARY OF THE INVENTION

One illustrative embodiment is directed to a method of processing data in a computer system comprising at least one host and at least one content addressable storage (CAS) system that performs a plurality of operations on content units for the at least one host, wherein the at least one host identifies the content units on the at least one CAS system using content addresses generated based, at least in part, on the content of the content units. The method comprises acts of: (A) receiving an input/output (I/O) request from the at least one host to perform an access on at least one of the content units on the at least one CAS system, wherein the I/O request includes at least one field that specifies at least one of the plurality of operations to be performed on the at least one content unit by the at least one CAS system; and (B) determining which of the plurality of operations is specified in the at least one field; wherein the acts (A) and (B) are performed before the I/O request is received by the CAS system. Another illustrative embodiment is directed to at least one computer readable medium encoded with instructions that, when executed on a computer system, perform the above-described method.

A further illustrative embodiment is directed to an apparatus for use in a computer system comprising at least one host and at least one content addressable storage (CAS) system that performs a plurality of operations on content units for the at least one host, wherein the at least one host executes at least one application program that identifies the content units on the at least one CAS system using content addresses generated based, at least in part, on the content of the content units. The apparatus comprises: an input for receiving input/output (I/O) requests from the application program before the I/O request is received by the at least one CAS system; and a controller that: receives, from the input, an input/output (I/O) request to perform an access on at least one of the content units on the at least one CAS system, wherein the I/O request includes at least one field that specifies at least one of the plurality of operations to be performed on the at least one content unit by the at least one CAS system; and determines which of the plurality of operations is specified in the at least one field.

Another illustrative embodiment is directed to a method of processing an input/output (I/O) request in a computer system comprising a first content addressable storage (CAS) system and a second CAS system that each processes content units using content addresses generated based, at least in part, on content of the content units. The method comprises acts of: (a) receiving the I/O request at the first CAS system, the I/O request seeking access to at least one content unit; (b) determining whether the I/O request is to be processed by the first CAS system or the second CAS system; and (c) when it is determined in the act (b) that the I/O request is to be processed by the second CAS system, forwarding the I/O request to the second CAS system.

A further illustrative embodiment is directed to a first content addressable storage (CAS) system for use in a computer system that comprises the first content addressable storage system and a second CAS system, each of which processes content units using content addresses generated based, at least in part, on content of the content units. The first content addressable storage system comprises: at least one storage device; and; a controller, coupled to the at least one storage device, that, in response to receipt of an I/O request seeking access to at least one content unit: determines whether the I/O request is to be processed by the first CAS system or the second CAS system; and when it determines that the I/O request is to be processed by the second CAS system, forwards the I/O request to the second CAS system.

Another illustrative embodiment of the invention is directed to a method of processing input/output (I/O) requests in a computer system comprising at least one host, at least one content addressable storage (CAS) system that performs a plurality of operations on content units for the at least one host, and an appliance that is separate from the at least one host and the CAS system, wherein the at least one host identifies a content unit on the at least one CAS system using a content address generated based, at least in part, on the content of the content unit. The method comprises acts, performed by the appliance, of: (A) receiving a first I/O from the at least one host, wherein the first I/O is a request to perform an operation that accesses a first content unit and involves the transmission of the first content unit between the at least one host and the at least one CAS system; (B) examining information relating to the first I/O request; (C) when it is determined, based on the information relating to the first I/O request, that at least one first condition is met, sending an instruction, to the at least one host that issued the first I/O request and/or the at least one CAS system, that causes the path for transmission of the first content unit between the at least one host and the at least one CAS system to not pass through the appliance; and (D) when it is determined, based on the information relating to the first I/O request, that the at least one first condition is not met, sending an instruction to the at least one host and/or to the at least one CAS system that causes the path for transmission of the first content unit between the at least one host and the at least one CAS system to pass through the appliance. Another illustrative embodiment is directed to at least one computer readable medium which, when executed on a computer system, performs the above-described method.

A further illustrative embodiment is directed to a computer system comprising: at least one host; at least one content addressable storage (CAS) system that performs a plurality of operations on content units for the at least one host, wherein the at least one host identifies a content unit on the at least one CAS system using a content address generated based, at least in part, on the content of the content unit; and an appliance that is separate from the at least one host and the at least one CAS system comprising at least one controller that: receives a first I/O from the at least one host, wherein the first I/O is a request to perform an operation that accesses a first content unit and involves the transmission of the first content unit between the at least one host and the at least one CAS system; examines information relating to the first I/O request; when it is determined, based on the information relating to the first I/O request, that at least one first condition is met, sends an instruction, to the at least one host that issued the first I/O request and/or the at least one CAS system, that causes the path for transmission of the first content unit between the at least one host and the at least one CAS system to not pass through the appliance; and when it is determined, based on the information relating to the first I/O request, that the at least one first condition is not met, sends an instruction to the at least one host and/or to the at least one CAS system that causes the path for transmission of the first content unit between the at least one host and the at least one CAS system to pass through the appliance.

Another illustrative embodiment is directed to a method of processing input/output (I/O) requests in a computer system comprising at least one host, at least one content addressable storage (CAS) system that performs a plurality of operations on content units for the at least one host, and an appliance that is separate from the at least one host and the at least one CAS system, wherein the at least one host identifies a content unit using a content address generated based, at least in part, on the content of the content unit. The method comprising acts, performed by the at least one host, of: transmitting a first I/O to the appliance, wherein the first I/O is a request to perform an operation that accesses a first content unit on the at least one CAS system, and wherein the operation involves the transmission of the first content unit between the at least one host and the at least one CAS system; and engaging in a communication session with the at least one CAS system so that the first content unit is transmitted between the at least one host and the at least one CAS system without passing through the appliance. A further illustrative embodiment is directed to at least one computer readable medium which, when executed on a computer system, performs the above-described method.

A further illustrative embodiment is directed to a host computer for use in a computer system comprising at least one content addressable storage (CAS) system that performs a plurality of operations on content units for the at least one host, wherein the at least one host identifies a content unit using a content address generated based, at least in part, on the content of the content unit and an appliance that is separate from the at least one host and the at least one CAS system. The host computer comprises: a memory; and at least one controller, coupled to the memory, that: transmits a first I/O to the appliance, wherein the first I/O is a request to perform an operation that accesses a first content unit on the at least one CAS system, and wherein the operation involves the transmission of the first content unit between the at least one host and the at least one CAS system; and engages in a communication session with the at least one CAS system so that the first content unit is transmitted between the at least one host and the at least one CAS system without passing through the appliance.

A further illustrative embodiment is directed to a method of processing an input/output (I/O) request in a computer system comprising at least one host, at least one content addressable storage (CAS) system that performs a plurality of operations on content units for the at least one host, and an appliance that is separate from the at least one host and the at least one CAS system, wherein the at least one host identifies a content unit using a content address generated based, at least in part, on the content of the content unit, wherein the I/O request is a request to perform an operation that accesses a first content unit on the at least one CAS system, and wherein the operation involves the transmission of the first content unit between the at least one host and the at least one CAS system. The method comprises acts, performed by the at least one CAS system, of: (A) receiving from the appliance a communication instructing the at least one CAS system to initiate transmission of the first content unit between the at least one host and the at least one CAS system; and (B) engaging in a communication session with the at least one host so that the first content unit is transmitted between the at least one host and the at least one CAS system without passing through the appliance. Another illustrative embodiment is directed to at least one computer readable medium which, when executed on a computer system, performs the above-described method.

Another illustrative embodiment is directed to a content address storage (CAS) system, for use in a computer system comprising at least one host, an appliance that is separate from the at least one host and the at least one CAS system, wherein the at least one host identifies a content unit using a content address generated based, at least in part, on the content of the content unit, wherein the I/O request is a request to perform an operation that accesses a first content unit on the at least one CAS system, wherein the operation involves the transmission of the first content unit between the at least one host and the at least one CAS system. The CAS system comprises: at least one storage device; and at least one controller, coupled to the at least one storage device, that: receives from the appliance a communication instructing the at least one CAS system to initiate transmission of the first content unit between the at least one host and the at least one CAS system; and engages in a communication session with the at least one host so that the first content unit is transmitted between the at least one host and the at least one CAS system without passing through the appliance.

Another illustrative embodiment is directed to a method of processing input/output (I/O) requests in a computer system comprising at least one host, at least one content addressable storage (CAS) system that performs a plurality of operations on content units for the at least one host, and an appliance that is separate from the at least one host and the at least one CAS system, wherein the at least one host identifies a content unit using a content address generated based, at least in part, on the content of the content unit. The method comprises acts, performed by the appliance, of: (A) receiving a first I/O from the at least one host, wherein the first I/O is a request to perform an operation that accesses a first content unit on the at least one CAS system, and wherein the operation involves the transmission of the first content unit between the at least one host and the at least one CAS system; and (B) establishing a communication session in which the first content unit is transmitted between the at least one host and the at least one CAS system without passing through the appliance. A further illustrative embodiment is directed to at least one computer readable medium which, when executed on a computer system, performs the above-described method.

Another illustrative embodiment is directed to an appliance for use in a computer system comprising at least one host and at least one content addressable storage (CAS) system that performs a plurality of operations on content units for the at least one host, wherein the at least one host identifies a content unit using a content address generated based, at least in part, on the content of the content unit. The appliance comprises: an input that receives a first I/O from the at least one host; and a controller, coupled to the input, that: receives the first I/O from the input, wherein the first I/O is a request to perform an operation that accesses a first content unit on the at least one CAS system, and wherein the operation involves the transmission of the first content unit between the at least one host and the at least one CAS system; and establishes a communication session in which the first content unit is transmitted between the at least one host and the at least one CAS system without passing through the appliance.

A further illustrative embodiment is directed to a method of processing input/output (I/O) requests in a computer system comprising at least one host, a first content addressable storage (CAS) system and a second CAS system, wherein the first and second CAS systems each performs a plurality of operations on content units for the at least one host, wherein the at least one host identifies a content unit using a content address generated based, at least in part, on the content of the content unit. The method comprises acts of: (A) receiving, at the first CAS system, a first I/O from the at least one host, wherein the first I/O is a request to perform an operation that accesses a first content unit on the second CAS system, and wherein the operation involves the transmission of the first content unit between the at least one host and the second CAS system; and (B) establishing a communication session in which the first content unit is transmitted between the at least one host and the second CAS system without passing through the first CAS system.

BRIEF DESCRIPTION OF THE DRAWINGS

FIG. 4 illustrates zoning performed by a CAS layer, in a computer system that includes a CAS system, in accordance with one embodiment of the invention;

DETAILED DESCRIPTION

Figure 1:
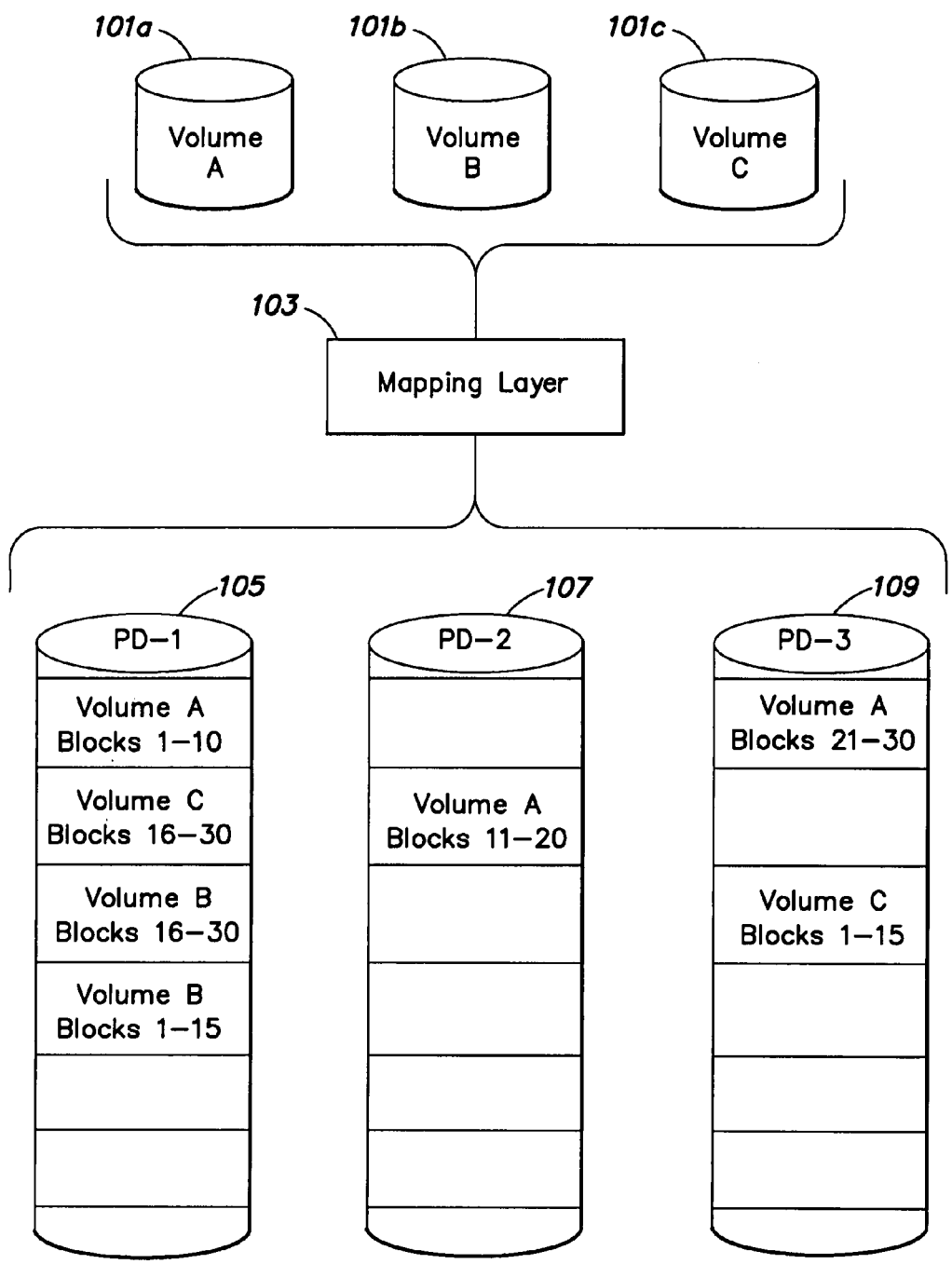
FIG. 1 schematically illustrates the mapping of logical volumes to physical storage devices in a prior art block I/O storage system.
Figure 2A:
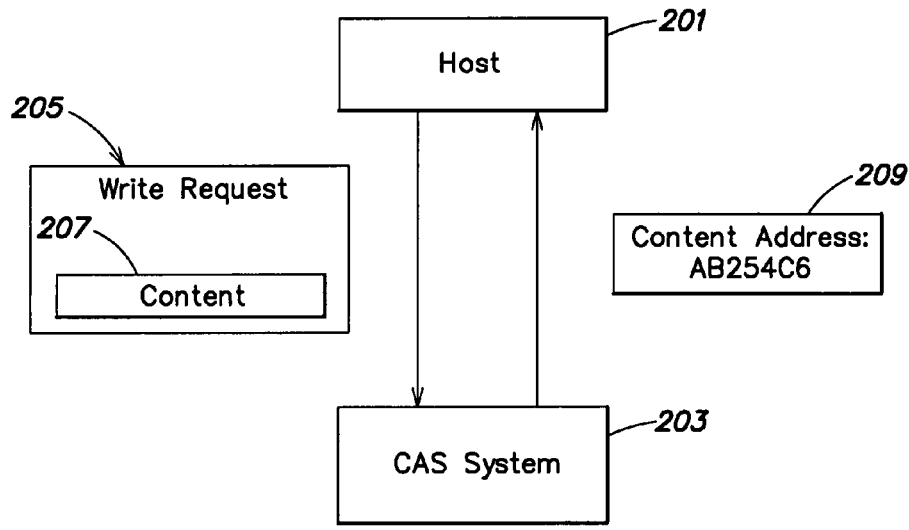
FIG. 2A illustrates the processing of a write request in a computer system that includes a CAS system.
Figure 2B:
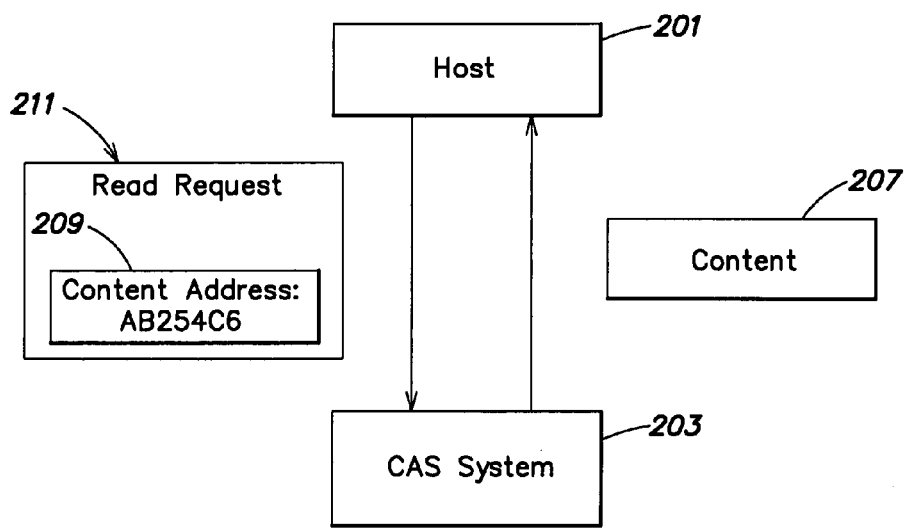
FIG. 2B is a block diagram of the processing of a read request in the computer system of FIG. 2A.

One embodiment of the invention is directed to use in a computer system that includes one or more CAS systems and one or more host computers, and is directed to a CAS layer that receives input/output (I/O) requests from a host and determines the operation specified by the I/O request. After determining the specified operation, the CAS layer can take any of numerous actions based thereon. The present invention is not limited in this respect, as a number of types of actions are possible, including directing (or redirecting) the I/O request to a destination; denying the I/O request; logging information concerning the I/O request; performing mirroring of writes to multiple locations; concatenating two or more I/O requests into a single I/O request, and other types of actions.

Another embodiment of the invention is directed to a CAS layer that executes on a CAS system in a computer system that includes multiple CAS systems. The CAS layer can receive an I/O request and determine whether the I/O request should be processed on the CAS system at which the request was received or another of the CAS systems in the computer system. When the CAS layer determines that the I/O request should be processed by the CAS system at which the request was received, the CAS layer passes the request to the portions of the CAS system that execute the specified operation. When the CAS layer determines that the I/O request should be processed by another CAS system, the CAS layer may forward the request to the other CAS system.

While prior art computer systems employing a CAS system have included layers of software that sit between an application program on the host and the CAS system and receive application requests from the application to the storage system (e.g., any communication between them), such layers typically only look at information in the access request such as destination routing information. These prior art layers of software do not analyze a field in the request that specifies an operation that the CAS system is requested to perform.

The CAS layer in accordance with embodiments of the present invention may reside on and be executed by any computer in the computer system. For example, the CAS layer (which may be implemented in software) may reside on one or more host computers, on one or more CAS systems, on an appliance that is separate from the host computer(s) and storage system(s), or may be distributed over any combination of the foregoing.

In one embodiment, the CAS layer can be provided as an add-on layer to a fully functional host/CAS system environment. This is advantageous as the CAS layer may add flexibility in implementing certain types of functionality, since the other portions of the functioning host/CAS system need not be modified to implement the functionality implemented on the CAS layer.

As mentioned above, in one embodiment of the invention, the CAS layer receives I/O requests and determines the operations specified thereby. This can be done in any suitable way, as the invention is not limited in this respect. For example, the interface between a host computer and a CAS system typically will include a set of instructions that the CAS system responds to, with one or more fields (e.g., an operation code or OPCODE) in an I/O request being dedicated to specifying which (if any) of the instructions is specified by a particular I/O request.

Figure 3B:
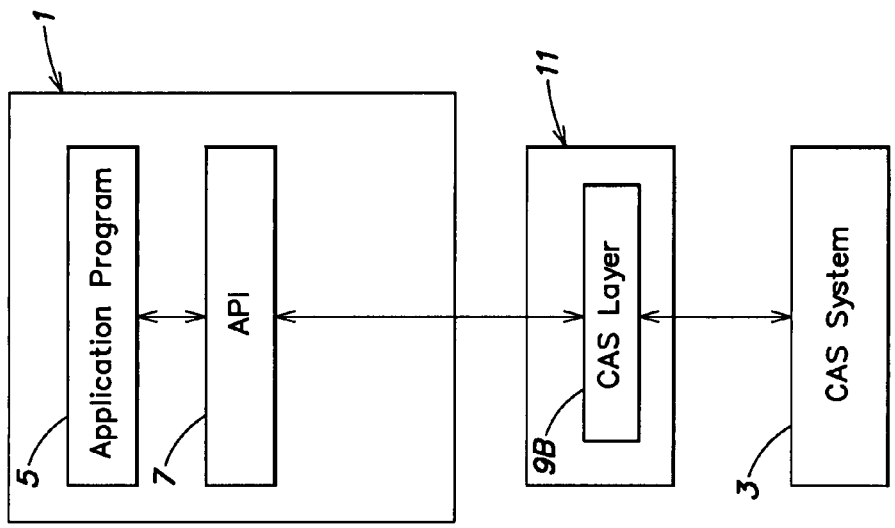
FIG. 3B is a block diagram of a computer system including an appliance that executes a CAS layer, in accordance with one embodiment of the invention.
Figure 3A:
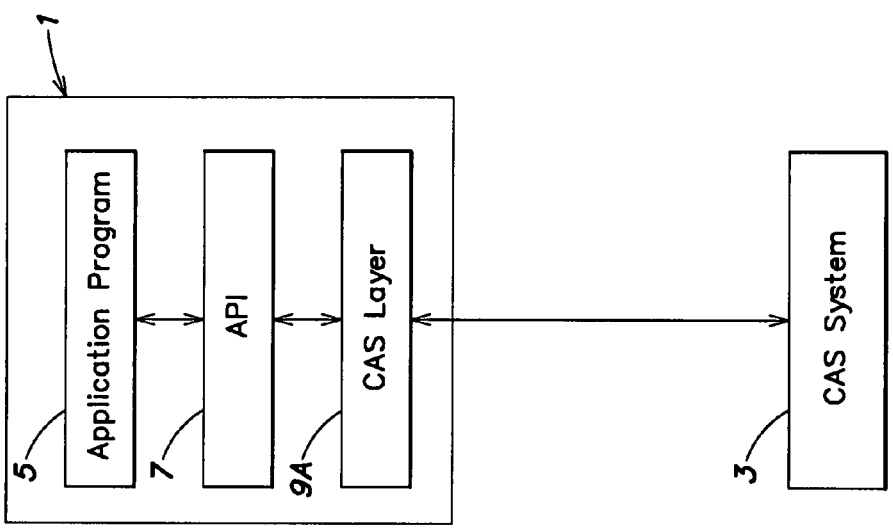
FIG. 3A is a block diagram of a computer system including a host computer that executes a CAS layer, in accordance with one embodiment of the invention.

FIG. 3A illustrates a computer system that includes a host computer 1 and content addressable storage (CAS) system 3, with the host computer 1 having a CAS layer 9A in accordance with one embodiment of the invention. In the system shown, the host computer executes an application program 5 and has an application programming interface (API) 7 that interfaces the application program 5 with the CAS system 3. However, the embodiments of the present invention described herein are not limited in this respect, as the aspects of the present invention described herein can be used with an application program that interfaces with a CAS system in any suitable way. The CAS software layer 9A receives I/O requests sent from the API 7 to the storage system 3 and analyzes those I/O requests (before they are received by the storage system) to determine which operation to be performed by CAS system 3 is specified in the request. As mentioned above, this determination can be made in any suitable way, such as by examining certain fields in the I/O request.

FIG. 3B illustrates a computer system in accordance with an alternate embodiment of the invention in which the CAS layer 9B is executed on an appliance 11 that is separate from host computer 1 and CAS system 3. As used herein, an appliance refers to any computer and is not limited to a server appliance. For example, the appliance may be a general purpose computer or may be a computer designed to perform a specific task or set of tasks, as the invention is not limited in this respect. As with the CAS layer 9A of FIG. 3A, the CAS layer 9B examines an I/O request sent from the host computer 1 to the CAS system 3 to determine which operation to be performed by CAS system 3 is specified in the request.

Figure 3C:
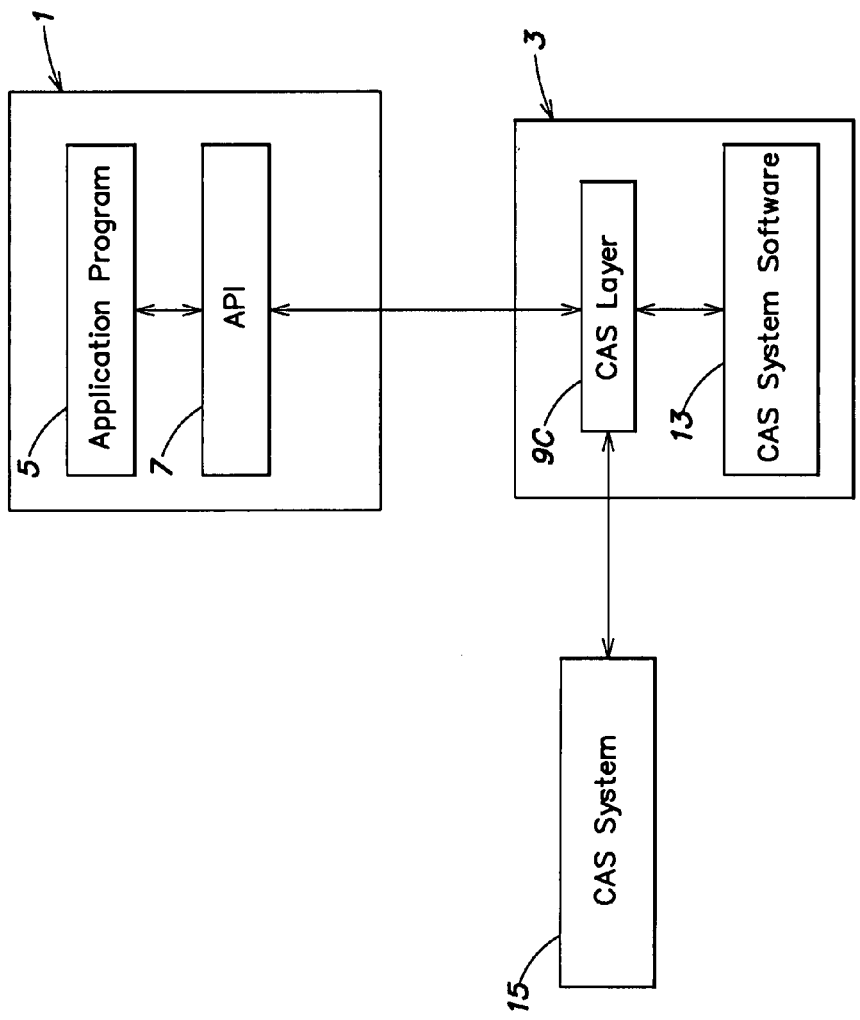
FIG. 3C is a block diagram of computer system including a CAS system that executes a CAS layer, in accordance with one embodiment of the invention.

FIG. 3C illustrates a computer system in accordance with yet another embodiment of the invention in which CAS layer 9C is executed by the CAS system 3. CAS layer 9C receives I/O requests from the host computer 1 and communicates with the execution engine (e.g., CAS system software 13) within the CAS system 3 based on the operations specified by the I/O requests. The CAS layer 9C may examine each I/O request and determine, based on information included in the I/O requests, whether to forward the requests to the CAS system software 13 for processing or to forward the requests to another CAS system (e.g., CAS system 15) in the computer system for processing.

In one embodiment, forwarding the I/O request received by the CAS Layer to a CAS system or host computer may include generating a new I/O request that is substantively the same as or similar to the received I/O request and sending the new I/O request to the CAS system or host computer.

Alternatively, forwarding the I/O request may include forwarding the received I/O request to the host computer or CAS Layer.

In some embodiments of the invention, the CAS layer may examine other fields of an I/O request in addition to (or instead of) the operation code or OPCODE field. For example, that CAS layer may examine a field that specifies the identity of the host computer that issued the I/O request, a field that specifies the identity of the application program executing on the host computer that issued the I/O request, and/or a field that specifies the content address(es) of the unit of content(s) to which the request relates.

In some embodiments, two or more different types of content addresses may be employed. As discussed above, a content address is generated at least in part from the content of its corresponding content unit, for example by a hashing a function to create a hash of the content. However, the content address may include additional information added to the hash of the content to create the content address. Examples of the type of information that can be added to the hash include a timestamp that indicates when the corresponding content unit was stored on the CAS system and/or a guaranteed unique identifier (GUID) that is included in the content address to further minimize the possibility that two content units in a computer system may have the same content address. Thus, access requests may include a field which indicates the type of content address, e.g., an address that does not include information in addition to a content hash, an address that also includes a timestamp, an address that includes a GUID, or other additional information formats. When used on a system that includes different types of content addresses the CAS layer may, in some embodiments, examine the field(s) that identifies the type of content address in making decisions about how to process an I/O request.

Any suitable type of I/O request may be employed and the invention is not limited in this respect. For example, the I/O request may be a read request to read a unit of content stored on a CAS system, a write request to store a unit of content on a CAS system, or a query request. A query request is a request to identify and/or return units of content that meet specified criteria. For example, a query request may seek to identify and/or return units of content that were stored on a CAS system during a specified time period.

It should be understood that a time period is only one example of a criterion that may be used in a query request. Indeed, any suitable criteria may be specified and the invention is not limited in this respect.

At least two different types of content may be stored on some CAS systems. The first type of content is descriptive data (e.g., application data), sometimes referred to as a blob. The second type of content is metadata, which is descriptive information about a unit of data or blob. For example, a data unit may be data such as a patient's x-ray, whereas metadata may include data about the x-ray, such as when the x-ray was taken, the name of the patient depicted in the x-ray, etc. In some CAS systems, metadata is stored in a content descriptor file (CDF) along with the content address of the blob to which the metadata pertains and an access request may include a field that indicates whether the content to which the access request relates is a blob or a CDF. Examples of a CAS system that employs blobs and CDFs are described in the applications below in Table 1. In one embodiment of the invention, the CAS layer may examine the field that indicates whether referenced content is a CDF or blob to determine how to process the access request. In addition, when the referenced unit of content is a CDF, in one embodiment, the CAS layer may also examine the metadata included in the CDF.

In the embodiments of FIGS. 3A–3C the CAS layer resides on only one of the host computer, appliance, or storage system. However, the invention is not limited in this respect, as the CAS layer may reside on any combination of these devices. For example, the CAS layer may reside on both the host computer and the appliance, the appliance and the CAS system, the CAS system and the host computer, or on all three devices. In embodiments where the CAS layer resides on two or more of these devices, the CAS layer on each device may implement all of the functionality of the CAS layer or the functionality may be distributed across the separate instances of the CAS layer, so that the CAS layer on one device (e.g., the CAS system) implements some of the functionality and the CAS layer on another device (e.g., the host computer) implements other functionality.

As mentioned above, while FIGS. 3A–3C show computer systems which employ an API to interface between the application program on the host computer and the CAS system, the invention is not limited to use with systems that employ such an API. Further, while the computer systems shown in FIGS. 3A–3C include only a single host computer and a single CAS system, the invention is not limited in this respect, and can be employed on computer systems that include multiple host computers and/or CAS systems. When used on a system including multiple hosts and/or storage systems, the CAS layer may reside on any or all of the host computers, CAS systems, and appliances that may be disposed therebetween.

Regardless of where the CAS layer is executed, the CAS layer may process I/O requests received from the API or application program and perform any of numerous functions based on those I/O requests. Examples of the functions which may be performed by the CAS layer are described below.

An example of a function that may be performed by the CAS layer is in implementing a collection of CAS systems in a manner referred to herein as a federation of CAS systems. A federation relates to using two or more CAS systems (also referred to as storage clusters) in a computer system, such that from the point of view of an application program, the multiple CAS systems appear as a single CAS system. Thus, the application program need not be concerned with on which CAS system a requested unit of content is stored and may treat the multiple CAS systems as a single CAS system. As an example, the application program may issue a request to read a unit of content. The CAS layer may receive the request, determine on which of the CAS systems the unit of data is stored, and forward the request to the appropriate CAS system. Implementing federations in a CAS computer system is described in greater detail in co-pending U.S. patent application Ser. No. 10/787,337, entitled "Methods And Apparatus For Increasing Data Storage Capacity," filed on Feb. 26, 2004, which is herein incorporated by reference in its entirety. It should be appreciated that the functionality described in that application relating to coordinating two or more CAS systems to work together as a federation may be implemented in a separate layer of software, such as the CAS layer.

It has been recognized that when processing access requests using a CAS layer there may be a detrimental performance impact in certain situations. For example, when an application program sends a write request to store a unit of content, the request and data may first be transferred from the application program to the CAS layer and then from the CAS layer to the CAS system. Similarly, in response to a read request, the CAS system may first transfer the requested content to the CAS layer. The CAS layer may then transfer the data to the application program. Transferring the data twice may increase network congestion and latency in the transfer of data.

Thus, in one embodiment invention, the CAS layer may be bypassed when reading or writing data. This may be done in any suitable way. For example, when processing a write request, a host computer sends the request to the CAS layer indicating that the host wishes to store a unit of data on the CAS system. The host computer waits for acknowledgement and/or approval of the request before transferring the data associated with the request (i.e., the data to be stored). The CAS layer may determine which CAS system is to store the data and send a reply to the host computer instructing it to contact that CAS system directly to store the data. Alternatively, the CAS layer may forward the request to the appropriate CAS system and set up a connection between the CAS system and the host computer to transfer the data.

Setting up a connection between the CAS system and host computer may be done in any suitable way. For example, the CAS layer may send a communication to instruct the CAS system to contact the host computer. Alternatively, the CAS layer may send communications to both the CAS system and the host computer to set up the connection.

Similarly, when processing a read request, the CAS layer may receive the request from the host computer, determine which CAS system(s) store(s) the requested content, and send a reply to the host computer to contact the CAS system directly. Alternatively, the CAS layer may forward the read request to the CAS system and set up a connection between the CAS system and the host computer to transfer the requested content from the CAS system to the host computer.

As described above, the CAS layer may execute on for example a host computer, a CAS system, or a separate appliance. In on embodiment, if the CAS layer executes on the CAS system which stores the unit of content requested in the I/O request, the CAS layer is not bypassed, as no additional network traffic is used in transferring the I/O request through the CAS layer.

In one embodiment of the invention, the CAS layer first examines the I/O request to determine if the I/O request meets one or more conditions. For example, the CAS layer may examine the quantity of data to be transferred by the read or write request. If the quantity of data exceeds a particular threshold, the CAS layer may establish a connection directly between the host and the CAS system to transfer the data, without the data passing through the CAS layer. If the quantity of data does not exceed the threshold, the data may be transferred between the host and the CAS system through the CAS layer.

In another embodiment of the invention, the CAS layer may be bypassed on all I/O requests involving transfer of data, regardless of any conditions, such as the size of the I/O request.

Another example of a function that may be performed by the CAS layer is referred to herein as zoning. Zoning may be used, for example, to implement a single entry point to cluster of CAS systems. For example, storage resources on a first CAS system may be allocated to a first host or application program, while storage resources on a second CAS system may be allocated to a second host or application program. In such a configuration it is possible to allow the first and second hosts or application programs to directly access the respective CAS systems, for example, by issuing an access request to the IP address of the appropriate CAS system. However, alternatively it may be desirable to instead provide a single entry point (e.g., a single IP address) used by all hosts or application programs to access the CAS systems. This may be implemented, for example, by providing the location of the CAS layer as the entry point to the cluster of CAS systems, and the CAS layer can ensure that communications are directed to the appropriate CAS system.

For example, the CAS layer may maintain (either on the same device(s) that the CAS layer operates upon or a different device) information that describes which storage resources are allocated to particular hosts or application programs. I/O requests from the host or application program may be received by the CAS layer and then forwarded to the CAS system allocated to that host or application program.

An illustrative example of a computer system including a CAS layer that can perform zoning is shown in FIG. 4. In FIG. 4, computer system 400 includes three entities (401a, 401b, and 401c) which access content on two CAS systems, 405a and 405b, through CAS layer 403. Entities 401a, 401b, and 401c may be host computers, application programs executing on one or more host computers, or any combination thereof. In the example of FIG. 4, CAS system 405a has resources allocated to entities 401a and 401b, and CAS system 405b has resources allocated to entity 401c. CAS layer 403 receives access requests from each of entities 401a, 401b, and 401c, and determines which CAS system has resources allocated to the entity that sent the request. The CAS layer may forward the access request to the appropriate CAS system.

Another function that may be performed by the CAS layer in one embodiment is indexing of data units stored on a CAS system. That is, for example, the CAS layer may maintain an index that identifies where on a CAS system (or group of CAS systems) units of content are stored. The manner in which the information relating to where a unit of content is stored is not limited in any respect and may differ depending on the configuration of the CAS system(s), For example, if a CAS system comprises a number of independent nodes, the index may record on which node(s) in the CAS system the data is stored and if the CAS system has a file system that organizes units of content stored therein, the index may also include information such as a file system location of a unit of content. The index may also specify a physical storage device (e.g., a disk) location of a unit of content. When the computer system includes multiple CAS systems, the index may record on which CAS system(s) units of content are stored.

Another example of an index that may be maintained by the CAS layer is an index that maps metadata to units of content (e.g., CDFs and/or blobs) to which the metadata pertains. For example, the metadata in the index may include information describing the content of a blob (e.g., medical records), information describing which CDFs reference a particular blob, the name of the application that stored a unit of content, etc. The above are only example of types of metadata that may be included in the index as any suitable type of metadata may be used and the invention is not limited in this respect.

In one embodiment, information may be added into the metadata index using metadata from CDFs. For example, when an application program sends a CDF with a write request or when the CAS system returns a CDF in response to a read request, the CAS layer may read metadata from the CDF and add the metadata into the index. However, it should be understood that this is only one example of a way in which information may be added into the metadata index, and the invention is not limited in this respect, as any suitable manner of adding information into the index may be used.

The index can be used by the CAS layer or other components in a computer system in any of numerous ways, and the invention is not limited in this respect. For example, when the CAS layer receives an access request that identifies a unit of content by its content address, the CAS layer may determine if the unit(s) of specified in the request are in the index maintained by the CAS layer. When the unit of content is in the index, the CAS layer may determine on which CAS system the unit of content is stored, the node on the CAS system that stores the unit of data, and/or the file system or disk location of the unit of content, or other information as discussed above. The CAS layer may then forward the access request to the CAS system, including information relating to where the unit of content is stored (e.g., such as the node on which the unit of data is stored and/or the file system or disk location of the unit of data). This information can improve the performance of the CAS system in handling the access request as it reduces any processing the CAS system will perform to determine where the unit of content is stored.

As another example, the metadata may be used when a host or application program wishes to search for a blob or CDF based on metadata. For example, a host or application program may issue a request for all CDFs that reference a blob having a particular content address or may issue a request for all blobs associated with a particular keyword, such as, for example, "medical records."

Another function that may be performed by the CAS layer is mirroring of content so that a unit of content is stored in two different locations on the storage system for fault tolerance and/or performance reasons. When an application program issues a write request to store a unit of content on a specified CAS system, the CAS layer may receive the write request and forward it to the specified CAS system. The CAS layer may also determine a location in the computer system to mirror the unit of content. The mirror location of the unit of content may be a different storage location in the same CAS system or may be in a different CAS system. The CAS layer may send a second write request to the appropriate CAS system to store a mirror copy of the unit of data.

In one embodiment, the mirroring of content may be transparent to the application program that issued the write request, such that the application program need not even be aware that the content is mirrored on one or more CAS systems. In another embodiment, the CAS layer may indicate to the application program that it has stored a mirror copy of the content on one or more CAS systems and may also indicate which CAS system stores the mirror copy. The CAS layer may perform mirroring either synchronously or asynchronously, as the invention is not limited in this respect. In synchronous mirroring, an indication that the write was successfully completed is not returned to the host until the unit of content is stored in all locations (including any mirror locations). In asynchronous mirroring an indication of a successful completion is returned to the host after the content unit is stored in one location and the mirror location can be written to at a later time (e.g., when the CAS system is less busy).

Another function that can be performed by the CAS layer is load balancing. In this respect, multiple copies of content units can be stored on different CAS systems, either by using the CAS layer mirroring techniques discussed above or in any other suitable way. When a host or application program requests access to a content unit stored on multiple CAS systems, the CAS layer may determine which CAS system that has a mirrored copy of the content unit is less busy (e.g., has less of a processing load) and may forward the request to that CAS system.

Yet another function that may be performed by the CAS layer is to implement control over one or more quality of service parameters. The specific nature of the quality of service parameters controlled is not a limitation of the present invention, as any of numerous quality of service can be controlled by the CAS layer. For example, the CAS layer may monitor and/or limit the number of connections from host computers to a CAS system. This can be done to either insulate the CAS system from processing connection requests, if the CAS system has reached its limit for the number of connections it can support, to prevent the CAS system from being overloaded by too many connections, which could impact the performance of the CAS system. The CAS layer may also monitor and limit the processing load of the CAS system and/or the number of data units that the CAS system processes in a given period of time. The CAS layer may limit the number of connections and processing load of the CAS system, as well as the number of content units that the CAS system processes, by denying an application program's or hosts access requests to the CAS System or by queuing those access requests and forwarding them to the CAS system once additional resources become available to handle the requests.

The CAS layer may also monitor the type of access requests sent between application programs and the CAS system (e.g., by analyzing a field in the access request to determine what operation is specified in the field). This information may be logged and/or used for any of numerous purposes, as the present invention is not limited in this respect. For example, the information may be used in charging customers that lease resources on a CAS system, so that the customer charges can be based on the number or type of access requests issued to a storage system by the customers' application programs.

The CAS layer may also control bandwidth consumed by a particular host or application program and/or the number of I/O requests issued by a particular host or application program. This can be done for any of numerous reasons. For example, the CAS layer may allow certain hosts or application programs to have more bandwidth or issue more I/O requests because the users of those hosts or application programs have paid for a higher quality of service from a CAS system.

In another embodiment, the CAS layer may also perform traffic analysis functions. For example, the CAS layer may track an application program's use of the CAS system's resources by monitoring, for example, the amount of content transferred to and from a particular application program or host, how much processing time the CAS system spent on the application program's or host's access requests, and any other suitable use of resources. This information may be used, for example, to better understand how the CAS system's resources are being used and/or to charge the users of application programs or host computers based on their amount of usage of the CAS system's resources, as mentioned above.

Another function that may be performed by the CAS layer is virus scanning. The CAS layer may receive units of content transferred from a host computer to a CAS system, or from a CAS system to a host computer, and scan these units of content for viruses. The CAS layer may also periodically scan units of content stored on the CAS system for viruses. Any suitable virus scanning techniques may be used, as the invention is not limited in this respect.

Figure 5:
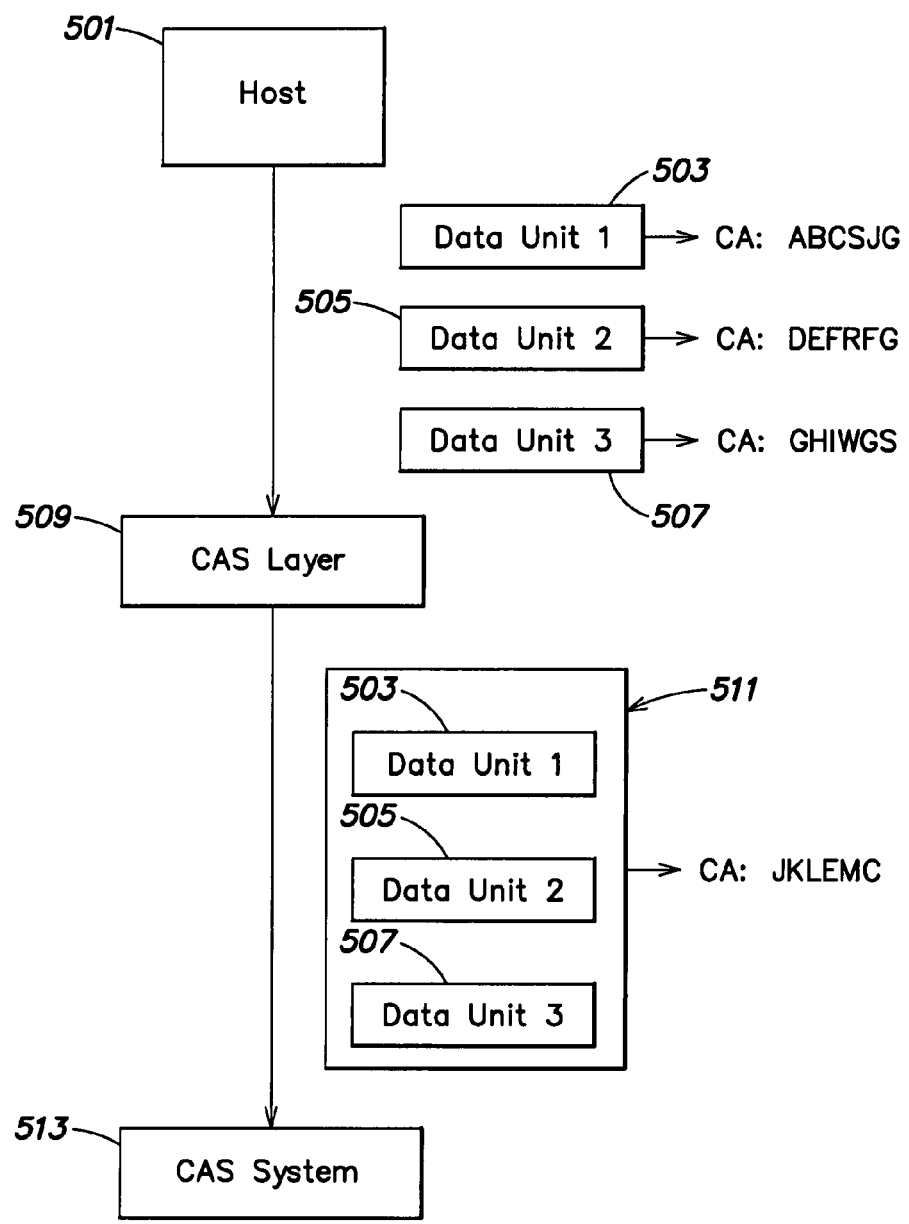
FIG. 5 illustrates containerization performed by a CAS layer, in a computer system that includes a CAS system, in accordance with one embodiment of the invention.

Yet another function that may be performed by the CAS layer is grouping a number of write requests into a single write request (referred to herein as containerization), to improve the performance of the computer system. An example of containerization is shown in FIG. 5, wherein a host computer issues three write requests: write request 503, write request 505, and write request 507. Write request 503 is a request to write a unit of content having content address ABCSJG, write request 505 is a request to write a unit of content having a content address DEFRFG, and write request 507 is a request to write a unit of content having a content address GHIWGS. CAS layer 509 may receive these three write requests and, instead of forwarding each write request separately to CAS System 513, may group content units 503, 505, and 507 into a single unit of content 511 having a content address JKLEMC. CAS layer 509 then may send a single write request to CAS System 513 to store content unit 511.

CAS layer 509 may maintain a record that indicates that content units 503, 505, and 507 were merged into a single unit of content having a content address JKLEMC and that indicates the offset of each of content units 503, 505, and 507 in content unit 511. When host computer 501 sends a read request to CAS system 513 to access one of content units 503, 505, or 507, CAS layer 509 may receive the request and recognize that the requested content unit was stored as content unit 511. CAS layer 509 may request content unit 511 from CAS system 513, extract the data unit requested by host computer 501 from content unit 511, and return the requested content unit to host computer 501.

By grouping a small number of writes into a single larger write, the CAS system's overhead of processing a write request may be reduced. For example, for each write request received, the CAS system may update one or more storage locations (e.g., a database) that include information that, for example, identifies where the unit of content associated with a particular content address is stored. Instead of having to perform such updates multiple times for multiple write requests, the CAS system need only perform a single update for the larger aggregated unit of content.

Another function that may be performed by the CAS layer is caching of content units. When an application program issues a write request to store a unit of content on a CAS system, CAS layer may receive the request and cache a copy of the unit of content. For subsequent access requests to the unit of content, the CAS layer cache can be used, thereby improving the performance of the system. It should be appreciated that the CAS layer cache can be provided in addition to any caching performed by the execution engine of the CAS system.

The CAS layer may also cache units of content returned from a CAS system in response to a read request from an application program. For example, the CAS layer may receive the response from the CAS System, cache the unit of content, and forward the response to the application program. If the CAS layer receives future requests for the cached unit of content, it may return the requested unit of content without requesting the unit of content from the CAS System.

The cache in the CAS layer can be organized and configured in any suitable way, as the invention is not limited in this respect. For example, the CAS layer may not immediately forward the content to a CAS system for storage. The cached unit of content may later be destaged to a CAS system by the CAS layer (e.g., when the unit of content is replaced in the cache by another unit of content or when the CAS system has processing resources available to handle the write request). Alternatively, the CAS layer may forward the application program's write request to the CAS System at the same time it caches the unit of content. In addition, any suitable cache replacement scheme may be used, as the invention is not limited in this respect.

Yet another function that may be performed by the CAS layer is to loosely connect (as compared with the federation functionality described above) two separate computer systems (each of which may include multiple CAS systems) through communication between CAS layers in the different computer systems. This can facilitate the finding of relevant content in other loosely associated systems. For example, a patient's medical records may be stored in a CAS computer system at a hospital in Boston. Thus, the medical records are units of content managed by the CAS layer of the CAS computer system at the Boston hospital. However, while traveling in San Francisco, the patient may require treatment at a hospital which also employs a CAS computer system. The CAS layer in the hospital computer system in San Francisco may maintain information listing other peer CAS computer systems (e.g., in other hospitals) and how to contact them over a network (e.g., using a network address, such as an IP address or in any other suitable way). The CAS layer may use this information to contact the peer CAS layers and ask if any have content relating to the patient, so that the computer system in Boston may respond. In addition to, or as an alternative to, storing the contact information for peer CAS layers, a CAS layer may store information (on the same device on which the CAS layer resides or another device) identifying all patients having records stored in the loosely coupled network (e.g., all hospitals). Such information is merely an identifier, and will not take up significant storage space for each patient. Thus, the CAS layer seeking access to a patient's records can check the stored information to determine whether the records are stored on the loosely coupled system, and if so, can seek to access those records. While the CAS layer does not directly manage the content units of all patient medical records, as they are stored in other computer systems, it may store an identifier for these records so that they are accessible by contacting a peer CAS layer in another computer system.

It should be appreciated that the use of loose coupling techniques described above or in any other suitable way to share medical records between hospitals is only one context in which these techniques may be employed, as these techniques may be used to share any suitable type of data between computer systems in any suitable context, as the invention is not limited in this respect.

It should further be appreciated that a CAS layer may implement all of the above described functionality or only some of the above described functionality, as the invention is not limited in this respect. The CAS layer may also implement another functionality that is not described above.

Figure 6:
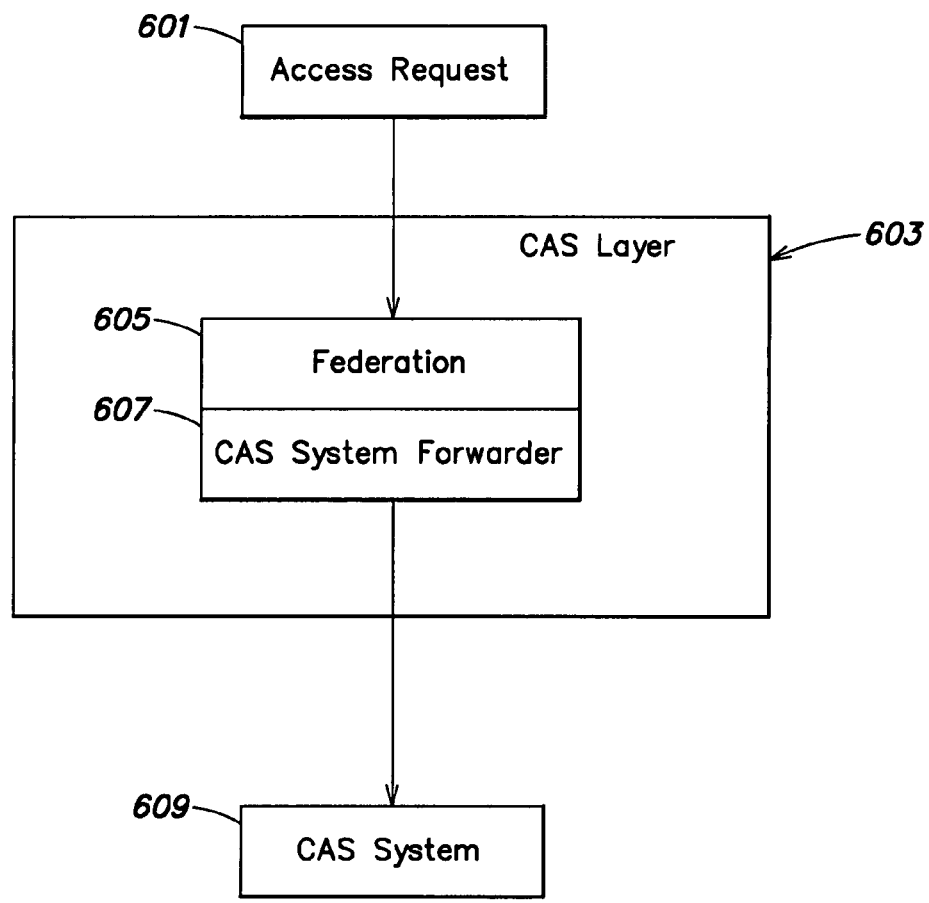
FIG. 6 illustrates a CAS layer implemented using layered drivers, in accordance with one embodiment of the invention.

The above-described functions of the CAS layer may be implemented in any suitable way. In one embodiment, the CAS layer functionality may be implemented as a set of layered drivers, each of which performs a specific portion of the functionality provided by the CAS layer. An example of this embodiment is shown in FIG. 6. CAS layer 603 is implemented using two layered drivers, i.e., a federation driver 605 and CAS system forwarder 607. Federation driver 605 performs the above-described federation functionality, i.e., it receives access request 601 and determines which CAS system the request should be directed to. After processing the access request, federation driver 605 then passes the request to the next driver in the layered stack, which is the CAS system forwarder driver 607 in the example of FIG. 6. The CAS system forwarder 607 performs the function of sending the access request to the CAS system determined by the federation layer 605 as the target for the request.

In the example of FIG. 6, the set of layered drivers includes only two layers. However, it should be understood that the set of layered drivers may include any suitable number of layers that perform the types of functions discussed above. For example, instead of, or in addition to, a federation driver, the set of layered drivers may include a mirroring driver which performs mirroring, a quality of service control driver, a virus scanning driver, and/or any other suitable driver.

Figure 7:
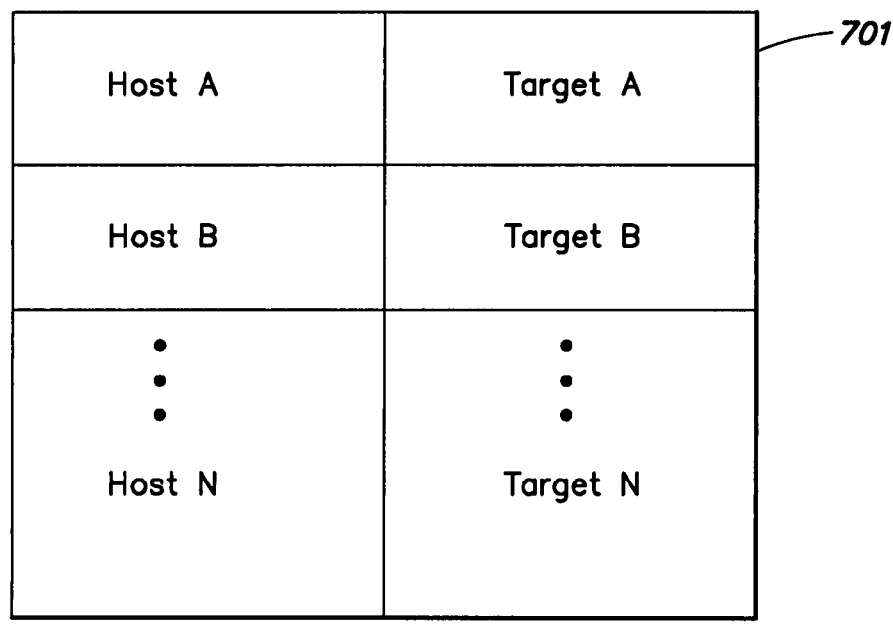
FIG. 7 illustrates a host-to-target table that may be used by the CAS layer of FIG. 6, in accordance with one embodiment of the invention.

In one embodiment, each layered driver is modular so that the set of layered drivers in the CAS layer may be altered, for example, based on the needs of the computer system, and so that the functionality provided by each can be coded separately, rather than having one monolithic set of code that implements the different functions. In one embodiment, different sets of layered drivers may be used to process requests from different host computers. For example, the CAS layer may employ a host-to-target mapping table, such as table 701 in FIG. 7, to determine which set of layered drivers should be used to process a request received from a particular host computer. For example, requests from Host A may be processed with layered driver Target A, while requests from Host B may be processed with layered driver Target B. The functions performed by the different sets of layered drivers may be different. For example, layered driver Target A, may be, for example, a set of layered drivers including a federation driver and a CAS system forwarder driver, while layered driver Target B may be, for example, a set of layered drivers including a virus scanning driver that performs virus scanning of content included in access requests, a quality of service control driver, and CAS system forwarder driver.

The set of layered drivers may be implemented in any suitable way, as the invention is not limited in this respect. For example, the access request may be passed through the layers of a set of layered drivers using a command data structure that includes the information from the access request that each layer may need to perform its function. Such a data structure may include fields for information such as, for example, a content address, a type of content address, an operation code, information that indicates whether data is a CDF or a blob, a timestamp, a transaction identifier that identifies a transaction of which the request forms a part, a reference identifier that identifies blobs referenced by a CDF (i.e., blobs about which the CDF has metadata), authentication information, and/or any other suitable information.

In one embodiment, a standard interface is used through which different drivers in a layered set may communicate (e.g., to transfer the above-described data structure and/or other communications). Such an interface may define a number of routines that a driver may call to communicate with another driver. Examples of these routines are send routines which may be called when processing command data structures relating to access requests going to a CAS system, receive routines which may be called when processing command data structures relating to access requests going from a CAS system (e.g., to a host computer or application program), begin transaction routines which may be called to signify the beginning of a CAS transaction, end transaction routines which may signify the end of a CAS transaction, insert and remove routines which allow the insertion or removal of additional drivers into the layered driver set, and/or any other suitable routine.

It should be appreciated that the above-described data structure and interface are provided only as examples as the invention is not limited to use of any particular interface or the use of a command data structure.

Further, instead of drivers interfacing directly with each other, the drivers may interface indirectly through another piece of software that may receive an access request from a layered driver after the driver has completed its processing, determine which driver should next receive the access request, and forward the access request to that driver.

Using a modular set of layered drivers provides the advantage that certain layered drivers may be coded by outside vendors that have expertise in a particular area related to the functionality of the layered driver. For example, an indexing layered driver may be coded by a vendor that has expertise in indexing and "plugged in" to the set of layered drivers.

The above-described embodiments of the present invention can be implemented on any suitable CAS system. Examples of suitable CAS systems are described in the patent applications listed below in Table 1, each of which is herein incorporated by reference. It should be appreciated that the CAS systems described in these applications are only examples of CAS systems on which embodiments of the present invention may be implemented, as the invention is not limited to implementation on any of these CAS systems.

Table 1

| Title | Ser. No. | Filing Date |
|---|---|---|
| Content Addressable Information, Encapsulation, Representation, And Transfer | 09/236,366 | Jan. 21, 1999 |
| Access To Content Addressable Data Over A Network | 09/235,146 | Jan. 21, 1999 |
| System And Method For Secure Storage Transfer And Retrieval Of Content Addressable Information | 09/391,360 | Sep. 7, 1999 |
| Method And Apparatus For Data Retention In A Storage System | 10/731,790 | Dec. 9, 2003 |
| Methods And Apparatus For Facilitating Access To Content In A Data Storage System | 10/731,613 | Dec. 9, 2003 |
| Methods And Apparatus For Caching A Location Index In A Data Storage System | 10/731,796 | Dec. 9, 2003 |
| Methods And Apparatus For Parsing A Content Address To Facilitate Selection Of A Physical Storage Location In A Data Storage System | 10/731,603 | Dec. 9, 2003 |
| Methods And Apparatus For Generating A Content Address To Indicate Data Units Written To A Storage System Proximate In Time | 10/731,845 | Dec. 9, 2003 |
| Methods And Apparatus For Modifying A Retention Period For Data In A Storage System | 10/762,044 | Jan. 21, 2004 |

-continued

| Title | Ser. No. | Filing Date |
| --- | --- | --- |
| Methods And Apparatus For Extending A Retention Period For Data In A Storage System | 10/761,826 | Jan. 21, 2004 |
| Methods And Apparatus For Indirectly Identifying A Retention Period For Data In A Storage System | 10/762,036 | Jan. 21, 2004 |
| Methods And Apparatus For Indirectly Identifying A Retention Period For Data In A Storage System | 10/762,043 | Jan. 21, 2004 |
| Methods And Apparatus For Increasing Data Storage Capacity | 10/787,337 | Feb. 26, 2004 |
| Methods And Apparatus For Storing Data In A Storage Environment | 10/787,670 | Feb. 26, 2004 |

The above-described embodiments of the present invention can be implemented in any of numerous ways. For example, the embodiments may be implemented using hardware, software or a combination thereof. When implemented in software, the software code can be executed on any suitable processor or collection of processors, whether provided in a single computer or distributed among multiple computers. It should be appreciated that any component or collection of components that perform the functions described above can be generically considered as one or more controllers that control the above-discussed functions. The one or more controllers can be implemented in numerous ways, such as with dedicated hardware, or with general purpose hardware (e.g., one or more processors) that is programmed using microcode or software to perform the functions recited above.

In this respect, it should be appreciated that one implementation of the embodiments of the present invention comprises at least one computer-readable medium (e.g., a computer memory, a floppy disk, a compact disk, a tape, etc.) encoded with a computer program (i.e., a plurality of instructions), which, when executed on a processor, performs the above-discussed functions of the embodiments of the present invention. The computer-readable medium can be transportable such that the program stored thereon can be loaded onto any computer environment resource to implement the aspects of the present invention discussed herein. In addition, it should be appreciated that the reference to a computer program which, when executed, performs the above-discussed functions, is not limited to an application program running on a host computer. Rather, the term computer program is used herein in a generic sense to reference any type of computer code (e.g., software or microcode) that can be employed to program a processor to implement the above-discussed aspects of the present invention.

It should be appreciated that in accordance with several embodiments of the present invention wherein processes are implemented in a computer readable medium, the computer implemented processes may, during the course of their execution, receive input manually (e.g., from a user).

In various examples described above, content addresses were described to include alphanumeric characters 'A'–'Z' and '0'–'9'. It should be understood that these content addresses were given only as examples, and that content addresses may include any alphanumeric character, series of bits, or any other suitable character, as the invention is not limited in this respect.

The phraseology and terminology used herein is for the purpose of description and should not be regarded as limiting. The use of "including," "comprising," "having," "containing", "involving", and variations thereof, is meant to encompass the items listed thereafter and additional items.

Having described several embodiments of the invention in detail, various modifications and improvements will readily occur to those skilled in the art. Such modifications and improvements are intended to be within the spirit and scope of the invention. Accordingly, the foregoing description is by way of example only, and is not intended as limiting. The invention is limited only as defined by the following claims and the equivalents thereto.

What is claimed is:

1. A method of processing input/output (I/O) requests in a computer system comprising at least one host, at least one content addressable storage (CAS) system that performs a plurality of operations on content units for the at least one host, and an appliance that is separate from the at least one host and the CAS system, wherein the at least one host identifies a content unit on the at least one CAS system using a content address generated based, at least in part, on the content of the content unit that is to be provided when the content unit is read from the CAS system, the method comprising acts, performed by the appliance, of:

(A) receiving a first I/O from the at least one host, wherein the first I/O is a request to perform an operation that accesses a first content unit and involves the transmission of the first content unit between the at least one host and the at least one CAS system;

(B) examining information relating to the first I/O request;

(C) when it is determined, based on the information relating to the first I/O request, that at least one first condition is met, sending an instruction, to the at least one host that issued the first I/O request and/or the at least one CAS system, that causes the path for transmission of the first content unit between the at least one host and the at least one CAS system to not pass through the appliance; and (D) when it is determined, based on the information relating to the first I/O request, that the at least one first condition is not met, sending an instruction to the at least one host and/or to the at least one CAS system that causes the path for transmission of the first content unit between the at least one host and the at least one CAS system to pass through the appliance.

2. The method of claim 1, wherein the act (A) comprises an act of receiving a first I/O that comprises a request to perform a write of the first content unit to the at least one CAS system.

3. The method of claim 1, wherein the act (A) comprises an act of receiving a first I/O that comprises a request to perform a read of the first content unit from the at least one CAS system.

4. The method of claim 1, wherein the act (B) comprises an act of examining information including a size of the first content unit, and wherein the first condition comprises the size of the first content unit meeting or exceeding a specified size.

5. The method of claim 2, wherein the act (C) comprises an act of, when it is determined that at least one first condition is met, sending an instruction to the at least one host instructing the at least one host to transmit the first content unit to the at least one CAS system.

6. The method of claim 2, wherein the act (C) comprises an act of, when it is determined that at least one first condition is met, sending an instruction to the at least one CAS instructing the at least one CAS to instruct the at least one host to transmit the first content unit to the at least one CAS system.

7. The method of claim 2, wherein the act (D) comprises an act of, when it is determined that at least one first condition is not met, sending an instruction to the at least one host instructing the at least one host to transmit the first content unit to the appliance.

8. The method of claim 3, wherein the act (D) comprises an act of, when it is determined that at least one first condition is not met, sending an instruction to the at least CAS system instructing the at least one CAS system to transmit the first content unit to the appliance.

9. The method of claim 3, wherein the act (C) comprises an act of, when it is determined that at least one first condition is met, sending an instruction to the at least CAS system instructing the at least one CAS system to transmit the first content unit to the at least one host.

10. At least one computer readable medium encoded with instructions that, when executed on a computer system, perform a method of processing input/output (I/O) requests, wherein the computer system comprises at least one host, at least one content addressable storage (CAS) system that performs a plurality of operations on content units for the at least one host, and an appliance that is separate from the at least one host and the CAS system, wherein the at least one host identifies a content unit on the at least one CAS system using a content address generated based, at least in part, on the content of the content unit that is to be provided when the content unit is read from the CAS system, the method comprising acts, performed by the appliance, of:

(A) receiving a first I/O from the at least one host, wherein the first I/O is a request to perform an operation that accesses a first content unit and involves the transmission of the first content unit between the at least one host and the at least one CAS system;

(B) examining information relating to the first I/O request;

(C) when it is determined, based on the information relating to the first I/O request, that at least one first condition is met, sending an instruction, to the at least one host that issued the first I/O request and/or the at least one CAS system, that causes the path for transmission of the first content unit between the at least one host and the at least one CAS system to not pass through the appliance; and (D) when it is determined, based on the information relating to the first I/O request, that the at least one first condition is not met, sending an instruction to the at least one host and/or to the at least one CAS system that causes the path for transmission of the first content unit between the at least one host and the at least one CAS system to pass through the appliance.

11. The at least one computer readable medium of claim 10, wherein the act (A) comprises an act of receiving a first I/O that comprises a request to perform a write of the first content unit to the at least one CAS system.

12. The at least one computer readable medium of claim 10, wherein the act (A) comprises an act of receiving a first I/O that comprises a request to perform a read of the first content unit from the at least one CAS system.

13. The at least one computer readable medium of claim 10, wherein the act (B) comprises an act of examining information including a size of the first content unit, and wherein the first condition comprises the size of the first content unit meeting or exceeding a specified size.

14. The at least one computer readable medium of claim 11, wherein the act (C) comprises an act of, when it is determined that at least one first condition is met, sending an instruction to the at least one host instructing the at least one host to transmit the first content unit to the at least one CAS system.

15. The at least one computer readable medium of claim 11, wherein the act (C) comprises an act of, when it is determined that at least one first condition is met, sending an instruction to the at least one CAS instructing the at least one CAS to instruct the at least one host to transmit the first content unit to the at least one CAS system.

16. The at least one computer readable medium of claim 11, wherein the act (D) comprises an act of, when it is determined that at least one first condition is not met, sending an instruction to the at least one host instructing the at least one host to transmit the first content unit to the appliance.

17. The at least one computer readable medium of claim 12, wherein the act (D) comprises an act of, when it is determined that at least one first condition is not met, sending an instruction to the at least CAS system instructing the at least one CAS system to transmit the first content unit to the appliance.

18. The at least one computer readable medium of claim 12, wherein the act (C) comprises an act of, when it is determined that at least one first condition is met, sending an instruction to the at least CAS system instructing the at least one CAS system to transmit the first content unit to the at least one host.

19. A computer system comprising:

at least one host;

at least one content addressable storage (CAS) system that performs a plurality of operations on content units for the at least one host, wherein the at least one host identifies a content unit on the at least one CAS system using a content address generated based, at least in part, on the content of the content unit that is to be provided when the content unit is read from the CAS system; and an appliance that is separate from the at least one host and the at least one CAS system comprising at least one controller that:

receives a first I/O from the at least one host, wherein the first I/O is a request to perform an operation that accesses a first content unit and involves the transmission of the first content unit between the at least one host and the at least one CAS system;

examines information relating to the first I/O request;

when it is determined, based on the information relating to the first I/O request, that at least one first condition is met, sends an instruction, to the at least one host that issued the first I/O request and/or the at least one CAS system, that causes the path for transmission of the first content unit between the at least one host and the at least one CAS system to not pass through the appliance; and when it is determined, based on the information relating to the first I/O request, that the at least one first condition is not met, sends an instruction to the at least one host and/or to the at least one CAS system that causes the path for transmission of the first content unit between the at least one host and the at least one CAS system to pass through the appliance.

20. The computer system of claim 19, wherein the at least one controller receives a first I/O that comprises a request to perform a write of the first content unit to the at least one CAS system.

21. The computer system of claim 19, wherein the at least one controller receives a first I/O that comprises a request to perform a read of the first content unit from the at least one CAS system.

22. The computer system of claim 19, wherein the at least one controller examines information including a size of the first content unit, and wherein the first condition comprises the size of the first content unit meeting or exceeding a specified size.

23. The computer system of claim 20, wherein at least one controller, when it is determined that at least one first condition is met, sends an instruction to the at least one host instructing the at least one host to transmit the first content unit to the at least one CAS system.

24. The computer system of claim 20, wherein the at least one controller, when it is determined that at least one first condition is met, sends an instruction to the at least one CAS instructing the at least one CAS to instruct the at least one host to transmit the first content unit to the at least one CAS system.

25. The computer system of claim 20, wherein the at least one controller, when it is determined that at least one first condition is not met, sends an instruction to the at least one host instructing the at least one host to transmit the first content unit to the appliance.

26. The computer system of claim 21, wherein the at least one controller, when it is determined that at least one first condition is not met, sends an instruction to the at least CAS system instructing the at least one CAS system to transmit the first content unit to the appliance.

27. The computer system of claim 21, wherein the at least one controller, when it is determined that at least one first condition is met, sends an instruction to the at least CAS system instructing the at least one CAS system to transmit the first content unit to the at least one host.

28. A method of processing input/output (I/O) requests in a computer system comprising at least one host, at least one content addressable storage (CAS) system that performs a plurality of operations on content units for the at least one host, and an appliance that is separate from the at least one host and the at least one CAS system, wherein the at least one host identifies a content unit using a content address generated based, at least in part, on the content of the content unit that is to be provided when the content unit is read from the CAS system, the method comprising acts, performed by the at least one host, of:
(A) transmitting a first I/O to the appliance, wherein the first I/O is a request to perform an operation that accesses a first content unit on the at least one CAS system, and wherein the operation involves the transmission of the first content unit between the at least one host and the at least one CAS system; and
(B) engaging in a communication session with the at least one CAS system so that the first content unit is transmitted between the at least one host and the at least one CAS system without passing through the appliance.

29. The method of claim 28, wherein the act (A) comprises an act of transmitting a first I/O that is a request to perform a read of the first content unit from the at least one CAS system; and
wherein the act (B) comprises an act of receiving the first content unit from the at least one CAS system without the first content unit passing through the appliance.

30. The method of claim 28, wherein the act (A) comprises an act of transmitting a first I/O that is a request to perform a write of the first content unit to the at least one CAS system; and
wherein the act (B) comprises an act of transmitting the first content unit to the at least one CAS system without passing the first content unit to the appliance.

31. The method of claim 30, further comprising an act, after the act (A), of receiving a communication from the at least one CAS system, and wherein the act (B) comprises an act of transmitting the first content unit in response to receipt of the communication from the at least one CAS system.

32. The method of claim 30, further comprising an act, after the act (A), of receiving a communication from the appliance, and wherein the act (B) comprises an act of transmitting the first content unit in response to receipt of the communication from the appliance.

33. At least one computer readable medium encoded with instructions that, when executed on a computer system, perform a method of processing input/output (I/O) requests, wherein the computer system comprises at least one host, at least one content addressable storage (CAS) system that performs a plurality of operations on content units for the at least one host, and an appliance that is separate from the at least one host and the at least one CAS system, wherein the at least one host identifies a content unit using a content address generated based, at least in part, on the content of the content unit that is to be provided when the content unit is read from the CAS system, the method comprising acts, performed by the at least one host, of:
(A) transmitting a first I/O to the appliance, wherein the first I/O is a request to perform an operation that accesses a first content unit on the at least one CAS system, and wherein the operation involves the transmission of the first content unit between the at least one host and the at least one CAS system; and
(B) engaging in a communication session with the at least one CAS system so that the first content unit is transmitted between the at least one host and the at least one CAS system without passing through the appliance.

34. The at least one computer readable medium of claim 33, wherein the act (A) comprises an act of transmitting a first I/O that is a request to perform a read of the first content unit from the at least one CAS system; and
wherein the act (B) comprises an act of receiving the first content unit from the at least one CAS system without the first content unit passing through the appliance.

35. The at least one computer readable medium of claim 33, wherein the act (A) comprises an act of transmitting a first I/O that is a request to perform a write of the first content unit to the at least one CAS system; and
wherein the act (B) comprises an act of transmitting the first content unit to the at least one CAS system without passing the first content unit to the appliance.

36. The at least one computer readable medium of claim 35, further comprising an act, after the act (A), of receiving a communication from the at least one CAS system, and wherein the act (B) comprises an act of transmitting the first content unit in response to receipt of the communication from the at least one CAS system.

37. The at least one computer readable medium of claim 35, further comprising an act, after the act (A), of receiving a communication from the appliance, and wherein the act (B) comprises an act of transmitting the first content unit in response to receipt of the communication from the appliance.

38. A host computer for use in a computer system comprising at least one content addressable storage (CAS) system that performs a plurality of operations on content units for the at least one host, wherein the at least one host identifies a content unit using a content address generated based, at least in part, on the content of the content unit that is to be provided when the content unit is read from the CAS system, and an appliance that is separate from the at least one host and the at least one CAS system, wherein the host computer comprises:
 a memory; and
 at least one controller, coupled to the memory, that:
  transmits a first I/O to the appliance, wherein the first I/O is a request to perform an operation that accesses a first content unit on the at least one CAS system, and wherein the operation involves the transmission of the first content unit between the at least one host and the at least one CAS system; and
  engages in a communication session with the at least one CAS system so that the first content unit is transmitted between the at least one host and the at least one CAS system without passing through the appliance.

39. The host computer of claim 38, wherein the at least one controller transmits a first I/O that is a request to perform a read of the first content unit from the at least one CAS system and receives the first content unit from the at least one CAS system without the first content unit passing through the appliance.

40. The host computer of claim 38, wherein the at least one controller transmits a first I/O that is a request to perform a write of the first content unit to the at least one CAS system and transmits the first content unit to the at least one CAS system without passing the first content unit to the appliance.

41. The host computer of claim 40, wherein the at least one controller receives a communication from the at least one CAS system and transmits the first content unit in response to receipt of the communication from the at least one CAS system.

42. The host computer of claim 40, wherein the at least one controller receives a communication from the appliance and transmits the first content unit in response to receipt of the communication from the appliance.

43. A method of processing an input/output (I/O) request in a computer system comprising at least one host, at least one content addressable storage (CAS) system that performs a plurality of operations on content units for the at least one host, and an appliance that is separate from the at least one host and the at least one CAS system, wherein the at least one host identifies a content unit using a content address generated based, at least in part, on the content of the content unit that is to be provided when the content unit is read from the CAS system, wherein the I/O request is a request to perform an operation that accesses a first content unit on the at least one CAS system, and wherein the operation involves the transmission of the first content unit between the at least one host and the at least one CAS system, the method comprising acts, performed by the at least one CAS system, of:
 (A) receiving from the appliance a communication instructing the at least one CAS system to initiate transmission of the first content unit between the at least one host and the at least one CAS system; and
 (B) engaging in a communication session with the at least one host so that the first content unit is transmitted between the at least one host and the at least one CAS system without passing through the appliance.

44. The method of claim 43, wherein the I/O is a request to perform a read of the first content unit from the at least one CAS system, and wherein the act (B) comprises an act of transmitting the first content unit from the at least one CAS system to the at least one host without the first content unit passing through the appliance.

45. The method of claim 43, wherein the I/O is a request to perform a write of the first content unit to the at least one CAS system, and wherein the act (B) comprises an act of receiving the first content unit from the at least one host without the first content unit passing the first content unit to the appliance.

46. The method of claim 45, wherein the act (B) comprises an act, prior to the act of receiving the first content unit, of transmitting to the at least one host a communication that causes the at least one host to transmit the first content unit to the at least one CAS system.

47. At least one computer readable medium encoded with instructions that, when executed on a computer system, perform a method of processing an input/output (I/O) request, wherein the computer system comprises at least one host, at least one content addressable storage (CAS) system that performs a plurality of operations on content units for the at least one host, and an appliance that is separate from the at least one host and the at least one CAS system, wherein the at least one host identifies a content unit using a content address generated based, at least in part, on the content of the content unit that is to be provided when the content unit is read from the CAS system, wherein the I/O request is a request to perform an operation that accesses a first content unit on the at least one CAS system, and wherein the operation involves the transmission of the first content unit between the at least one host and the at least one CAS system, the method comprising acts, performed by the at least one CAS system, of:
 (A) receiving from the appliance a communication instructing the at least one CAS system to initiate transmission of the first content unit between the at least one host and the at least one CAS system; and
 (B) engaging in a communication session with the at least one host so that the first content unit is transmitted between the at least one host and the at least one CAS system without passing through the appliance.

48. The at least one computer readable medium of claim 47, wherein the I/O is a request to perform a read of the first content unit from the at least one CAS system, and wherein the act (B) comprises an act of transmitting the first content unit from the at least one CAS system to the at least one host without the first content unit passing through the appliance.

49. The at least one computer readable medium of claim 47, wherein the I/O is a request to perform a write of the first content unit to the at least one CAS system, and wherein the act (B) comprises an act of receiving the first content unit from the at least one host without the first content unit passing the first content unit to the appliance.

50. The at least one computer readable medium of claim 49, wherein the act (B) comprises an act, prior to the act of receiving the first content unit, of transmitting to the at least one host a communication that causes the at least one host to transmit the first content unit to the at least one CAS system.

51. A content address storage (CAS) system, for use in a computer system comprising at least one host, an appliance that is separate from the at least one host and the at least one CAS system, wherein the at least one host identifies a content unit using a content address generated based, at least in part, on the content of the content unit that is to be provided when the content unit is read from the CAS system, wherein the I/O request is a request to perform an operation that accesses a first content unit on the at least one CAS system, wherein the operation involves the transmission of the first content unit between the at least one host and the at least one CAS system, and wherein that CAS system comprises:
  at least one storage device; and
  at least one controller, coupled to the at least one storage device, that:
  receives from the appliance a communication instructing the at least one CAS system to initiate transmission of the first content unit between the at least one host and the at least one CAS system; and
  engages in a communication session with the at least one host so that the first content unit is transmitted between the at least one host and the at least one CAS system without passing through the appliance.

52. The CAS system of claim 51, wherein the I/O is a request to perform a read of the first content unit from the at least one CAS system, and wherein the at least one controller transmits the first content unit from the at least one CAS system to the at least one host without the first content unit passing through the appliance.

53. The CAS system of claim 51, wherein the I/O is a request to perform a write of the first content unit to the at least one CAS system, and wherein the at least one controller receives the first content unit from the at least one host without the first content unit passing the first content unit to the appliance.

54. The CAS system of claim 53, wherein the at least one controller, prior to the act of receiving the first content unit, transmits to the at least one host a communication that causes the at least one host to transmit the first content unit to the at least one CAS system.

55. A method of processing input/output (I/O) requests in a computer system comprising at least one host, at least one content addressable storage (CAS) system that performs a plurality of operations on content units for the at least one host, and an appliance that is separate from the at least one host and the at least one CAS system, wherein the at least one host identifies a content unit using a content address generated based, at least in part, on the content of the content unit that is to be provided when the content unit is read from the CAS system, the method comprising acts, performed by the appliance, of:
  (A) receiving a first I/O from the at least one host, wherein the first I/O is a request to perform an operation that accesses a first content unit on the at least one CAS system, and wherein the operation involves the transmission of the first content unit between the at least one host and the at least one CAS system; and
  (B) establishing a communication session in which the first content unit is transmitted between the at least one host and the at least one CAS system without passing through the appliance.

56. The method of claim 55, wherein the act (B) comprises an act of sending a communication to the at least one CAS system instructing the at least one CAS system to initiate transmission of the first content unit between the at least one host and the at least one CAS system.

57. The method of claim 55, wherein the act (B) comprises an act of sending a communication to the at least one host instructing the at least one host to initiate transmission of the first content unit between the at least one host and the at least one CAS system.

58. The method of claim 56, wherein the act (A) comprises an act of receiving a first I/O that is a request to perform a read of the first content unit from the at least one CAS system; and
  wherein the act (B) comprises an act of sending a communication to the at least one CAS system instructing the at least one CAS system to transmit the first content unit to the at least one host without passing the first content unit to the appliance.

59. The method of claim 56, wherein the act (A) comprises an act of receiving a first I/O that is a request to perform a write of the first content unit to the at least one CAS system; and
  wherein the act (B) comprises an act of sending a communication to the at least one CAS system instructing the at least one CAS system to communicate with the at least one host and request that the at least one host transmit the first content unit to the at least one CAS system without passing the first content unit to the appliance.

60. The method of claim 57, wherein the act (A) comprises an act of receiving a first I/O that is a request to perform a write of the first content unit to the at least one CAS system; and
  wherein the act (B) comprises an act of sending a communication to the at least one host instructing the at least one host to transmit the first content unit to the at least one CAS system without passing the first content unit to the appliance.

61. The method of claim 56, wherein the at least one CAS system comprises a plurality of CAS systems, and wherein the act (B) comprises acts of:
  determining at least one of the plurality of CAS systems as a target for the first I/O, and
  sending the communication to the target CAS system.

62. The method of claim 55, wherein the act (A) comprises an act of receiving a first I/O that is a request to perform a read of the first content unit to the at least one CAS system; and
  wherein the act (B) comprises an act of sending a communication to the at least one host instructing the at least one host to transmit the first I/O request to the at least one CAS system with passing the first I/O request to the appliance.

63. At least one computer readable medium encoded with instructions that, when executed on a computer system, perform a method of processing input/output (I/O) requests, wherein the computer system comprises at least one host, at least one content addressable storage (CAS) system that performs a plurality of operations on content units for the at least one host, and an appliance that is separate from the at least one host and the at least one CAS system, wherein the at least one host identifies a content unit using a content address generated based, at least in part, on the content of the content unit that is to be provided when the content unit is read from the CAS system, the method comprising acts, performed by the appliance, of:
  (A) receiving a first I/O from the at least one host, wherein the first I/O is a request to perform an operation that accesses a first content unit on the at least one CAS system, and wherein the operation involves the trans mission of the first content unit between the at least one host and the at least one CAS system; and (B) establishing a communication session in which the first content unit is transmitted between the at least one host and the at least one CAS system without passing through the appliance.

64. The at least one computer readable medium of claim 63, wherein the act (B) comprises an act of sending a communication to the at least one CAS system instructing the at least one CAS system to initiate transmission of the first content unit between the at least one host and the at least one CAS system.

65. The at least one computer readable medium of claim 63, wherein the act (B) comprises an act of sending a communication to the at least one host instructing the at least one host to initiate transmission of the first content unit between the at least one host and the at least one CAS system.

66. The at least one computer readable medium of claim 64, wherein the act (A) comprises an act of receiving a first I/O that is a request to perform a read of the first content unit from the at least one CAS system; and wherein the act (B) comprises an act of sending a communication to the at least one CAS system instructing the at least one CAS system to transmit the first content unit to the at least one host without passing the first content unit to the appliance.

67. The at least one computer readable medium of claim 64, wherein the act (A) comprises an act of receiving a first I/O that is a request to perform a write of the first content unit to the at least one CAS system; and wherein the act (B) comprises an act of sending a communication to the at least one CAS system instructing the at least one CAS system to communicate with the at least one host and request that the at least one host transmit the first content unit to the at least one CAS system without passing the first content unit to the appliance.

68. The at least one computer readable medium of claim 65, wherein the act (A) comprises an act of receiving a first I/O that is a request to perform a write of the first content unit to the at least one CAS system; and wherein the act (B) comprises an act of sending a communication to the at least one host instructing the at least one host to transmit the first content unit to the at least one CAS system without passing the first content unit to the appliance.

69. The at least one computer readable medium of claim 64, wherein the at least one CAS system comprises a plurality of CAS systems, and wherein the act (B) comprises acts of:

determining at least one of the plurality of CAS systems as a target for the first I/O, and sending the communication to the target CAS system.

70. The at least one computer readable medium of claim 63, wherein the act (A) comprises an act of receiving a first I/O that is a request to perform a read of the first content unit to the at least one CAS system; and wherein the act (B) comprises an act of sending a communication to the at least one host instructing the at least one host to transmit the first I/O request to the at least one CAS system with passing the first I/O request to the appliance.

71. An appliance for use in a computer system comprising at least one host and at least one content addressable storage (CAS) system that performs a plurality of operations on content units for the at least one host, wherein the at least one host identifies a content unit using a content address generated based, at least in part, on the content of the content unit that is to be provided when the content unit is read from the CAS system, and wherein the appliance comprises:

an input that receives a first I/O from the at least one host; and a controller, coupled to the input, that:
receives the first I/O from the input, wherein the first I/O is a request to perform an operation that accesses a first content unit on the at least one CAS system, and wherein the operation involves the transmission of the first content unit between the at least one host and the at least one CAS system; and establishes a communication session in which the first content unit is transmitted between the at least one host and the at least one CAS system without passing through the appliance.

72. The appliance of claim 71, wherein the at least one controller sends a communication to the at least one CAS system instructing the at least one CAS system to initiate transmission of the first content unit between the at least one host and the at least one CAS system.

73. The appliance of claim 71, wherein the act (B) at least one controller sends a communication to the at least one host instructing the at least one host to initiate transmission of the first content unit between the at least one host and the at least one CAS system.

74. The appliance of claim 72, wherein the at least one controller receives a first I/O that is a request to perform a read of the first content unit from the at least one CAS system and sends a communication to the at least one CAS system instructing the at least one CAS system to transmit the first content unit to the at least one host without passing the first content unit to the appliance.

75. The appliance of claim 72, wherein the at least one controller receives a first I/O that is a request to perform a write of the first content unit to the at least one CAS system and sends a communication to the at least one CAS system instructing the at least one CAS system to communicate with the at least one host and request that the at least one host transmit the first content unit to the at least one CAS system without passing the first content unit to the appliance.

76. The appliance of claim 73, wherein the at least one controller receives a first I/O that is a request to perform a write of the first content unit to the at least one CAS system and sends a communication to the at least one host instructing the at least one host to transmit the first content unit to the at least one CAS system without passing the first content unit to the appliance.

77. The appliance of claim 72, wherein the at least one CAS system comprises a plurality of CAS systems, and wherein the at least one controller determines at least one of the plurality of CAS systems as a target for the first I/O and sends the communication to the target CAS system.

78. The appliance of claim 71, wherein the at least one controller receives a first I/O that is a request to perform a read of the first content unit to the at least one CAS system and sends a communication to the at least one host instructing the at least one host to transmit the first I/O request to the at least one CAS system with passing the first I/O request to the appliance.

79. A method of processing input/output (I/O) requests in a computer system comprising at least one host, a first content addressable storage (CAS) system and a second CAS system, wherein the first and second CAS systems each performs a plurality of operations on content units for the at least one host, wherein the at least one host identifies a content unit using a content address generated based, at least in part, on the content of the content unit that is to be provided when the content unit is read from the CAS system, the method comprising acts of:

(A) receiving, at the first CAS system, a first I/O from the at least one host, wherein the first I/O is a request to perform an operation that accesses a first content unit on the second CAS system, and wherein the operation involves the transmission of the first content unit between the at least one host and the second CAS system; and (B) establishing a communication session in which the first content unit is transmitted between the at least one host and the second CAS system without passing through the first CAS system.

80. The host computer of claim 51 in combination with the computer system.

81. The appliance of claim 71 in combination with the computer system.

* * * * *